(12) United States Patent
Ku

(10) Patent No.: US 7,451,768 B2
(45) Date of Patent: Nov. 18, 2008

(54) SYSTEM FOR PLACEMENT OF CIRCUIT PANEL HAVING INTERCONNECTED BOARD UNITS

(76) Inventor: Shing-San Ku, 3F, No. 10, Alley 22, Lane 160, Ta-Hu St., Nei-Hu Dist., Taipei City (TW)

( * ) Notice: Subject to any disclaimer, the term of this patent is extended or adjusted under 35 U.S.C. 154(b) by 44 days.

(21) Appl. No.: 11/527,016

(22) Filed: Sep. 26, 2006

(65) Prior Publication Data
US 2007/0087630 A1 Apr. 19, 2007

(30) Foreign Application Priority Data
Oct. 18, 2005 (TW) .............................. 94136297 A

(51) Int. Cl.
*B23P 21/00* (2006.01)
*B23Q 23/00* (2006.01)

(52) U.S. Cl. .................... 29/701; 29/407.01; 29/407.05; 29/720; 29/721

(58) Field of Classification Search .............. 29/407.01, 29/407.05, 701, 720, 721
See application file for complete search history.

(56) References Cited

U.S. PATENT DOCUMENTS 5,148,591 A * 9/1992 Pryor ....................... 29/407.04
6,317,953 B1 * 11/2001 Pryor ....................... 29/407.04
6,609,297 B1 * 8/2003 Hiramatsu et al. ............ 29/852
7,102,148 B2 * 9/2006 Kodama et al. ........ 250/559.44
7,127,812 B2 * 10/2006 Hiramatsu et al. ............ 29/852

FOREIGN PATENT DOCUMENTS

TW 228020 2/2005

* cited by examiner

*Primary Examiner*—C. J Arbes
(74) *Attorney, Agent, or Firm*—Ohlandt, Greeley, Ruggiero & Perle, L.L.P.

(57) ABSTRACT

In a board placement method and system, a PCB panel having multiple interconnected PCB units and a vacant space is placed on a work surface of a reference platform. The work surface has an opening corresponding to the vacant space. The reference platform has a micro-adjusting unit, which includes a support seat disposed in the opening and movable along three directions. The support seat is used for placement of a good PCB unit. The current positions of the PCB panel and the good PCB unit are measured so as to calculate a target position of the good PCB unit and an error between the target position and the current position of the good PCB unit. The micro-adjusting unit can drive the support seat to move so as to move the good PCB unit to the target position. The good PCB unit is then fixed in the vacant space.

13 Claims, 12 Drawing Sheets

SYSTEM FOR PLACEMENT OF CIRCUIT PANEL HAVING INTERCONNECTED BOARD UNITS

CROSS-REFERENCE TO RELATED APPLICATION

This application claims priority of Taiwanese Application No. 094136297, filed on Oct. 18, 2005.

BACKGROUND OF THE INVENTION

1. Field of the Invention

The invention relates to a board placement method and system for a defective printed circuit board panel having multiple interconnected printed circuit board units, more particularly to an automated board placement method and system for a defective printed circuit board panel having multiple interconnected printed circuit board units.

2. Description of the Related Art

In the manufacture of a conventional printed circuit board panel, a plurality of independent printed circuit board units (hereinafter referred to as PCB units) are arranged and mounted on a substrate to form a printed circuit board panel having multiple interconnected PCB units so as to facilitate large-volume and quick component insertion on a production line. The defective product rate for printed circuit board panels having multiple interconnected PCB units during manufacture is about 5% to 7%. Since component insertion for a printed circuit board panel having multiple interconnected PCB units on a production line is generally set with fixed path values, whenever there is a defective PCB unit in the printed circuit board panel, most manufacturers will simply dispose of the same as non-usable, thereby resulting in waste of resources. Some manufacturers will identify the defective PCB unit in the printed circuit board panel in advance, and modify the component insertion path so as to skip the component insertion operation for the defective PCB unit. However, such a process is time-consuming and inefficient, and is not economically effective.

It is noted that the term "interconnected" as used herein means "structural interconnected," not "electrically connected."

In order to solve the aforesaid problems, generally, the defective PCB unit of the printed circuit board panel is cut out, and is replaced by a good PCB unit removed from another defective printed circuit board panel such that the printed circuit board panel becomes a good printed circuit board panel. Thus, defective printed circuit board panels having multiple interconnected PCB units can be utilized to avoid waste of resources. One such scheme is proposed in R.O.C. Invention Patent No. 228020.

In the aforesaid patent, optical positioning and computer positioning of the good PCB unit and the defective printed circuit board panel are performed by means of manual visual inspection of magnified images on a display, and the good PCB unit is simultaneously moved automatically or manually to be aligned with a vacant space in the defective printed circuit board panel. However, the aforesaid patent failed to disclose an automated process for performing moving alignment, which may be difficult in practice. After completion of the positioning is shown on the display, adhesive tapes are used to position the good PCB unit on the defective printed circuit board panel. Then, glue is injected manually to fill clearances between the good PCB unit and the defective printed circuit board panel, which are then delivered to a high-temperature furnace for curing. After the curing operation, manual steps are undertaken to remove the adhesive tapes, to inspect the circuit board panel, and to remove excess glue, thereby completing board replacement.

Furthermore, the aforesaid patent merely contemplates the positioning of the good PCB units on a planar surface. In practice, the surface of the printed circuit board panel is not a completely flat planar surface, and may have an inclination angle. Therefore, even if the good PCB unit is positioned according to the process disclosed in the aforesaid patent, if there is a drop between the good PCB unit and the printed circuit board panel at the joint, the printed circuit board panel will still be determined to be a defective printed circuit board panel.

In the board replacement process disclosed in the aforesaid patent and the conventional board replacement process adopted by manufacturers, with the exception of the cutting of the defective and good PCB units which is performed using a computer automated technique, the remaining operations are conducted manually. However, performing manual visual inspection concurrently with alignment and positioning is likely to affect precision. Besides, since the quality of the operators is inconsistent, unstable quality problems, such as a high redo rate, a low repair rate, etc., may result. In addition, the process of board replacement is complicated, and the speed of manual operation is slow, thereby resulting in low production capacity and rendering fast mass production impossible. Therefore, there is room for improving conventional techniques of board replacement for printed circuit board panels having multiple interconnected PCB units.

SUMMARY OF THE INVENTION

Therefore, an object of the present invention is to provide a board placement method and system for a printed circuit board panel having multiple interconnected PCB units, which can enhance repair precision and stability.

Another object of the present invention is to provide a board placement method and system for a printed circuit board panel having multiple interconnected PCB units, which is capable of automated alignment and positioning, and automated glue injection and clearing.

Still another object of the present invention is to provide a board placement method and system for a printed circuit board panel having multiple interconnected PCB units, which can enhance repair rate through automated operations, and which permits fast mass production.

Accordingly, a board placement method for a printed circuit board panel having multiple interconnected PCB units of this invention includes:

(A) placing a printed circuit board panel having a vacant space on a work surface of a reference platform, the work surface having an opening corresponding to the vacant space, the reference platform having a micro-adjusting unit disposed therein, the micro-adjusting unit including a support seat which is disposed in the opening, and which is controllable to move along three directions, and which is for placement of a good PCB unit thereon;

(B) measuring current positions of the printed circuit board panel and the good PCB unit so as to calculate a target position of the good PCB unit, and comparing the target position with the current position of the good PCB unit so as to calculate an error therebetween;

(C) according to the error thus calculated, controlling the micro-adjusting unit to drive the support seat to move so as to move the good PCB unit to the target position; and (D) fixing the good PCB unit in the vacant space of the printed circuit board panel.

In step (A), the micro-adjusting unit includes a micro-adjusting table disposed below the support seat and capable of enabling the support seat to move relative to the work surface along an X-axis direction, a Y-axis direction, and a Z-axis direction. A first axial line passing through midpoints of two opposite sides of the support seat, a second axial line passing through midpoints of two other sides of the support seat, and a third axial line at the intersection of the first and second axial lines and parallel to the Z-axis direction are defined. The micro-adjusting table can drive the support seat to rotate relative to the work surface with the first, second and third axial lines as axes, respectively.

The method further includes a step (E) of storing comparison positioning reference data in a computer device before step (A). The comparison positioning reference data are data of positional relationship between the printed circuit board panel and the good PCB unit. In particular, the comparison positioning reference data are optical point data of a good printed circuit board panel having multiple interconnected PCB units, and may be predetermined path data, profile data, or image data thereof.

In step (B), data of the current positions of the printed circuit board panel and the good PCB unit are acquired by a camera of a measuring unit and are sent to the computer device. The computer device first calculates the target position of the good PCB unit based on the comparison positioning reference data and the current position of the printed circuit board panel, and further calculates the error between the target position and the current position of the good PCB unit.

In step (C), the micro-adjusting table drives the support seat to move horizontally along the X-axis direction and the Y-axis direction, and drives the support seat to rotate, with the third axial line as axis, so as to micro-adjust the good PCB unit to the target position.

In step (E), a work path of a laser of the measuring unit is predetermined in the computer device. In step (B), the laser is employed to measure respective height differences between connecting portions of the good PCB unit and corresponding positions of the printed circuit board panel and, in step (C), the micro-adjusting table is driven to move along the Z-axis direction, and to rotate the support seat, with the first and second axial line as axes, so as to achieve a state of levelness between the connecting portions of the good PCB unit and the corresponding positions of the printed circuit board panel.

In step (E), a work path of a glue injecting unit is predetermined in the computer device, and a work path of a glue clearing unit in the form of a high-speed glue clearing head is predetermined in the computer device. In step (D), the glue injecting unit injects glue into seams between the plurality of connecting portions of the good PCB unit and the plurality of corresponding positions of the printed circuit board panel along the predetermined work path of the glue injecting unit. After glue injection by the glue injecting unit, the computer device drives a curing unit to work at the seams between the good PCB unit and the printed circuit board panel where glue was injected so as to cure the glue in the seams. Preferably, the glue injected by the glue injecting unit is ultraviolet curable glue, and the curing unit is a light source for radiating ultraviolet light. After operation of the curing unit, the glue clearing unit is driven to remove excess glue at the seams between the good PCB unit and the printed circuit board panel along the predetermined work path of the glue clearing unit.

The method further includes a step (F) after step (D), in which the computer device drives the camera of the measuring unit to measure a difference between the position of the good PCB unit after fixing and the target position, and records the difference for comparison with a predetermined position tolerance range such that acceptance is determined when the difference is within the position tolerance range, and such that non-acceptance is determined when the difference is outside the position tolerance range. The computer device drives the laser of the measuring unit to measure height differences between the connecting portions of the good PCB unit after fixing and the corresponding positions of the printed circuit board panel along the predetermined work path of the laser, and records the height differences for comparison with a predetermined height tolerance range such that acceptance is determined when the height differences are within the height tolerance range, and such that non-acceptance is determined when the height differences are outside the height tolerance range.

In step (A), the work surface is provided with at least one positioning member for coupling with the printed circuit board panel. The first positioning member is a positioning frame for abutting against the printed circuit board panel. In addition, the first positioning member can be a plurality of insert pins, whereas the printed circuit board panel is provided with a plurality of holes to engage the insert pins. On the other hand, the support seat is provided with a plurality of second positioning members in the form of positioning pins. The good PCB unit is provided with a plurality of positioning holes to engage the positioning pins.

A board placement system for a printed circuit board panel having multiple interconnected PCB units of this invention includes a reference platform, a micro-adjusting unit, a mechanical arm, and a computer device.

The reference platform includes a work surface, a first positioning member disposed on the work surface, and an opening disposed in a right lateral edge of the work surface. The first positioning member is an L-shaped positioning frame. The micro-adjusting unit is disposed within the reference platform, and includes a micro-adjusting table and a support seat disposed on the micro-adjusting table, located within the opening, and flush with the work surface. The micro-adjusting table can bring the support seat to move relative to the work surface along an X-axis direction, a Y-axis direction, and a Z-axis direction, and to rotate with first, second and third axial lines as axes.

The mechanical arm includes a first support frame provided at a rear side of the reference platform, and a second support frame provided at a front side of the first support frame. A bottom end of the second support frame is provided with a measuring unit, a glue injecting unit, a glue clearing unit, and a curing unit. The measuring unit includes a camera and a laser. The glue injecting unit is a glue injecting machine for injecting ultraviolet curable glue. The glue clearing unit is a high-speed glue clearing head. The curing unit is a light source for radiating ultraviolet light. The computer device is disposed at an outer side of the reference platform, and is connected electrically to the first support frame of the mechanical arm and the micro-adjusting unit to control operations of the mechanical arm and the micro-adjusting unit, respectively.

In the board placement method and system for a printed circuit board panel having multiple interconnected PCB units of the present invention, through the use of a computer device to control measurement, glue injection, glue clearing, and curing, as well as automated operation of the micro-adjusting unit, precision and stability of board placement and board repair can be considerably enhanced, and the repair rate can be increased to be suitable for fast mass production.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
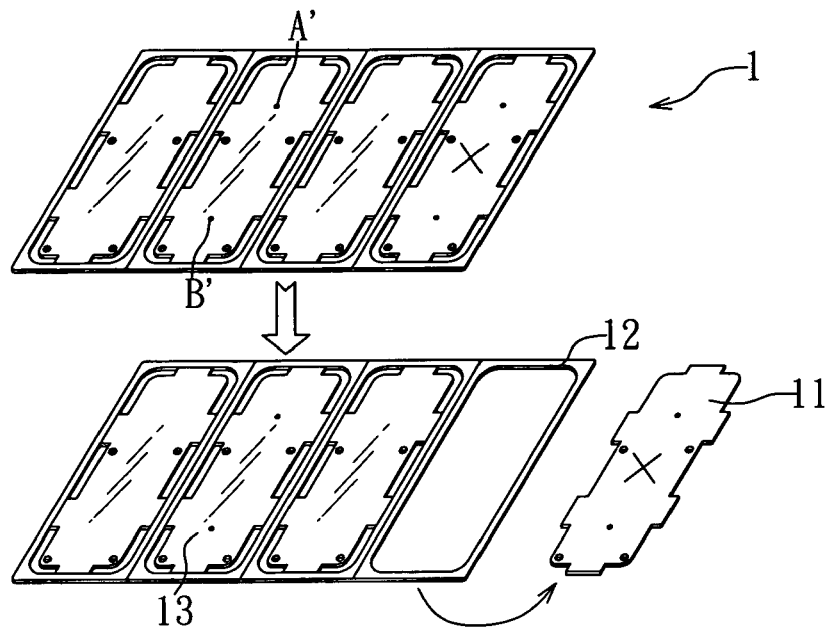
FIG. 1 is a schematic operational diagram to illustrate the first preferred embodiment of a board placement method for a defective printed circuit board panel having multiple interconnected PCB units according to the present invention.

Before the present invention is described in greater detail, it should be noted that like elements are denoted by the same reference numerals throughout the disclosure.

Figure 2:
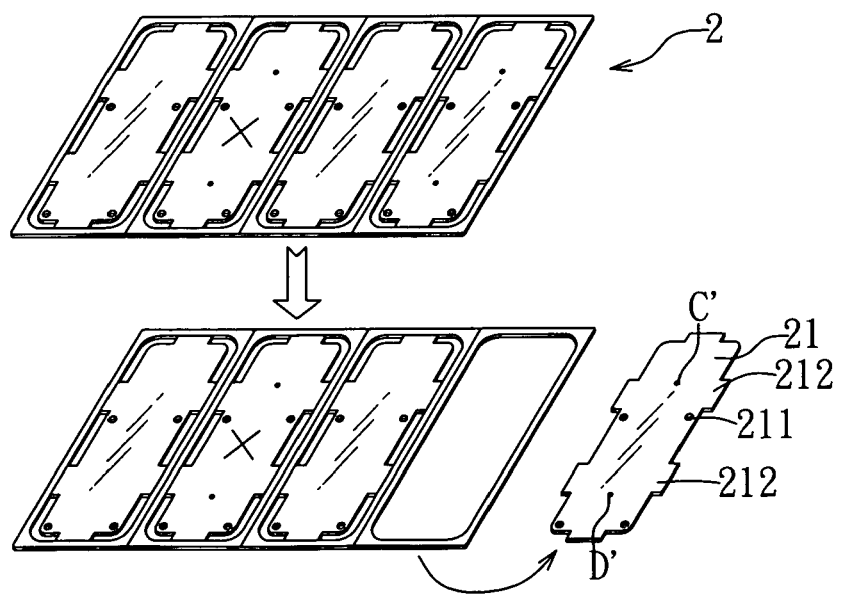
FIG. 2 is a schematic operational diagram illustrating the first preferred embodiment.

The board placement method and system for a defective printed circuit board panel having multiple interconnected PCB units according to the present invention is to use a good PCB unit of a defective printed circuit board panel having multiple interconnected PCB units for replacement in another defective printed circuit board panel so as to form a good repaired printed circuit board pair having multiple interconnected PCB units. Accordingly, referring to FIGS. 1 and 2, when there is a defective printed circuit board panel 1 having multiple interconnected PCB units, a defective PCB unit 11 is cut out and removed from the defective printed circuit board panel 1. A good PCB unit 21 is cut out from another defective printed circuit board panel 2 having multiple interconnected PCB units in the same manner for subsequent use. The cutting operation is conducted using an automated high-speed cutting tool (not shown) that is controlled by a computer to cut out the defective PCB unit 11 and the good PCB unit 21 along the same cutting path and in the same manner. The good PCB unit 21 has four symmetrical positioning holes 211 formed therein, and is provided with six connecting portions 212 that project from a peripheral edge thereof. After the defective PCB unit 11 is cut from the defective printed circuit board panel 1, the defective printed circuit board panel 1 has a vacant space 12 formed therein.

Figure 3:
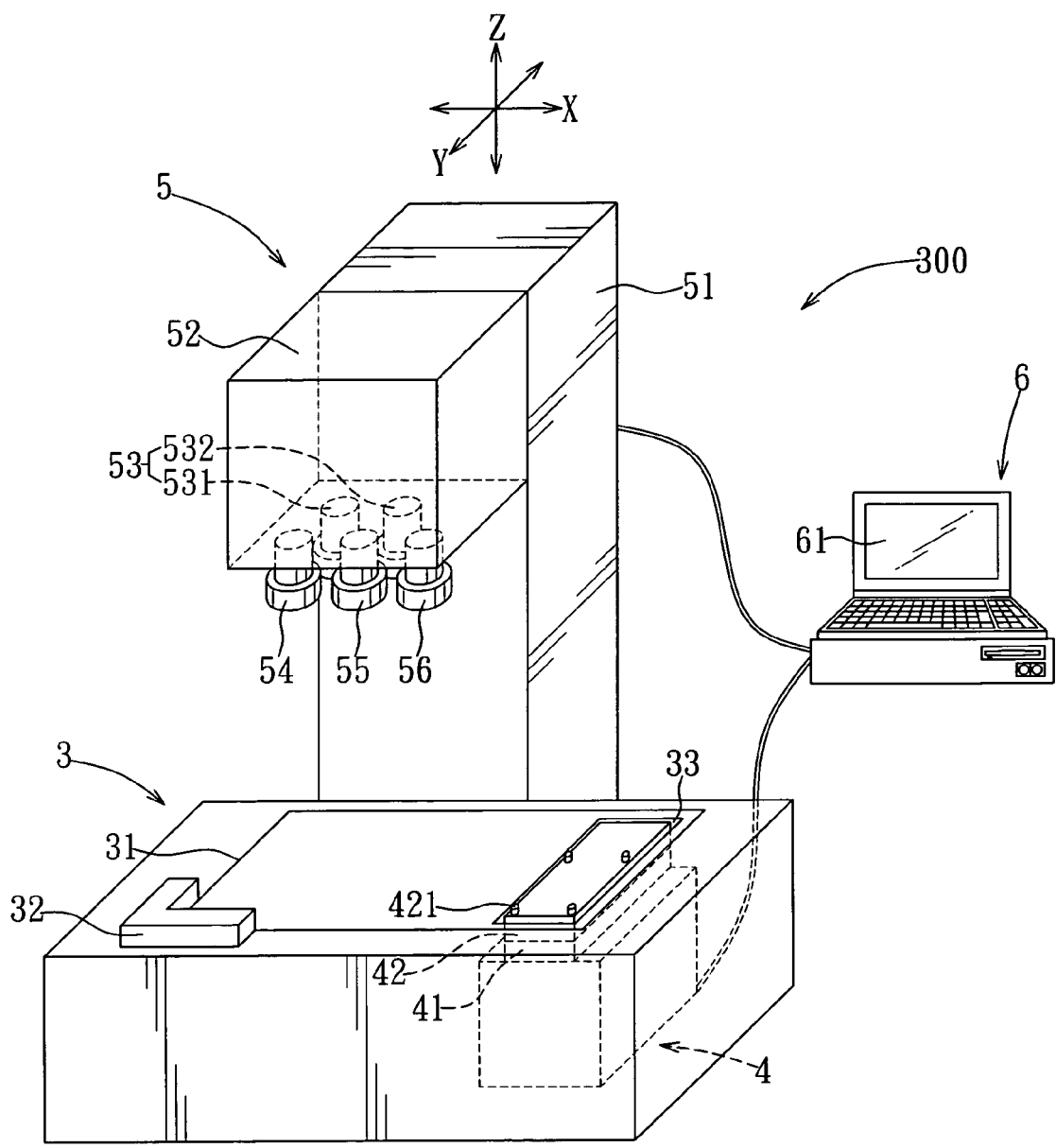
FIG. 3 is a perspective view of the first preferred embodiment of a board placement system according to this invention.

As shown in FIG. 3, a board placement system 300 for a defective printed circuit board panel having multiple interconnected PCB units according to the present invention is shown to include a reference platform 3 formed from a granite material, a micro-adjusting unit 4, a mechanical arm 5, and a computer device 6.

The reference platform 3 includes a work surface 31 disposed at a top end, and a first positioning member provided detachably on the work surface 31 and proximate to a front left side. The first positioning member is a substantially L-shaped positioning frame 32 in this embodiment. The work surface 31 is provided with a substantially rectangular opening 33 proximate to a right lateral edge.

Figure 4:
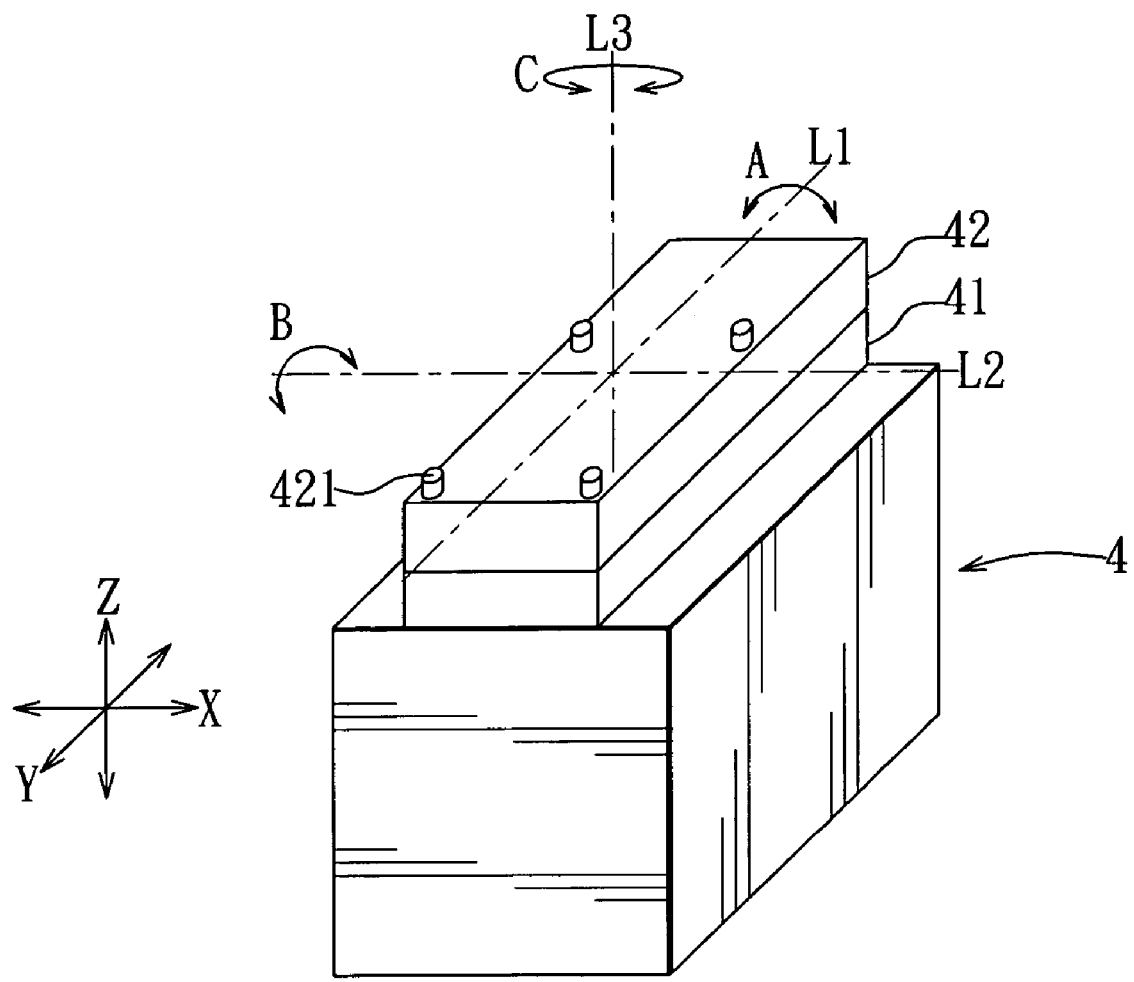
FIG. 4 is a perspective view of a micro-adjusting unit of the first preferred embodiment.

Referring further to FIG. 4, the micro-adjusting unit 4 is provided within the reference platform 3, and includes an elongated micro-adjusting table 41, and a support seat 42 provided replaceably on a top face of the micro-adjusting table 41. A top face of the support seat 42 is located within the opening 33 in the reference platform 3, and is flush with the work surface 31. Besides, the support seat 42 has four second positioning members that correspond respectively to the positioning holes 211 in the good PCB unit 21 in position and that project upwardly from the top face. In this embodiment, each of the second positioning members is a positioning pin 421 such that the good PCB unit 21 can be positioned on the top face of the support seat 42. In addition, the micro-adjusting unit 4 can control the micro-adjusting table 41 to perform micro-distance movement and micro-angle rotation relative to the work surface 31 of the reference platform 3. In particular, the micro-adjusting platform 41 can drive the support seat 42 to perform precise micron movement relative to the work surface 31 along a left-to-right extending X-axis direction, a front-to-rear extending Y-axis direction, and a top-to-bottom extending Z-axis direction. Further, a first axial line (L1) is defined to be located at the top face of the support seat 42 and passing through midpoints of two short sides of the support seat 42, a second axial line (L2) is defined to be located at the top face of the support seat 42 and passing through midpoints of two long sides of the support seat 42, and a third axial line (L3) is defined to be at an intersection of the first and second axial lines (L1), (L2) and parallel to the Z-axis direction. The micro-adjusting table 41 can bring the support seat 42 to perform precise micron rotation in a direction indicated by the arrow (A), with the first axial line (L1) as axis, and can perform precise micron rotation in a direction indicated by the arrow (B), with the second axial line (L2) as axis, as well as can perform precise micron rotation in a direction indicated by the arrow (C), with the third axial line (L3) as axis.

The mechanical arm 5 includes a first support frame 51 disposed at a rear side of the reference platform 3, and a second support frame 52 disposed at a front side of the first support frame 51 and located above the work surface 31. The first support frame 51 can move leftward and rightward relative to the reference platform 3 along the X-axis direction, whereas the second support frame 52 can move forward and rearward relative to the first support frame 51 along the Y-axis direction, and can simultaneously move upward and downward along the Z-axis direction. Therefore, the second support frame 52 is movable to any position above the work surface 31. In addition, a bottom end of the second support frame 52 is provided with a measuring unit 53, a glue injecting unit 54, a glue clearing unit 55, and a curing unit 56. The measuring unit 53 includes a camera 531 in the form of a charged coupled device (CCD), and a laser 532. The glue injecting unit 54 is a glue injecting machine for injecting ultraviolet curable glue. The glue clearing unit 55 is a high-speed glue clearing head, whereas the curing unit 56 is a light source for radiating ultraviolet light.

The computer device 6 is provided on an outer side of the reference platform 3, and is connected electrically to the first support frame 51 of the mechanical arm 5 and the micro-adjusting unit 4 for controlling operations of the mechanical arm 5 and the micro-adjusting unit 4, respectively. The computer device 6 includes a display screen 61 for displaying work status.

The board placement method for a printed circuit board panel having multiple interconnected PCB units of this invention will be illustrated with reference to FIGS. 3, 5 and 6. In the embodiment to be described hereinbelow, it is supposed that the printed circuit board panel to be subjected to board placement is a new type, and such type of printed circuit board panel has not yet been subjected to board placement.

Figure 6:
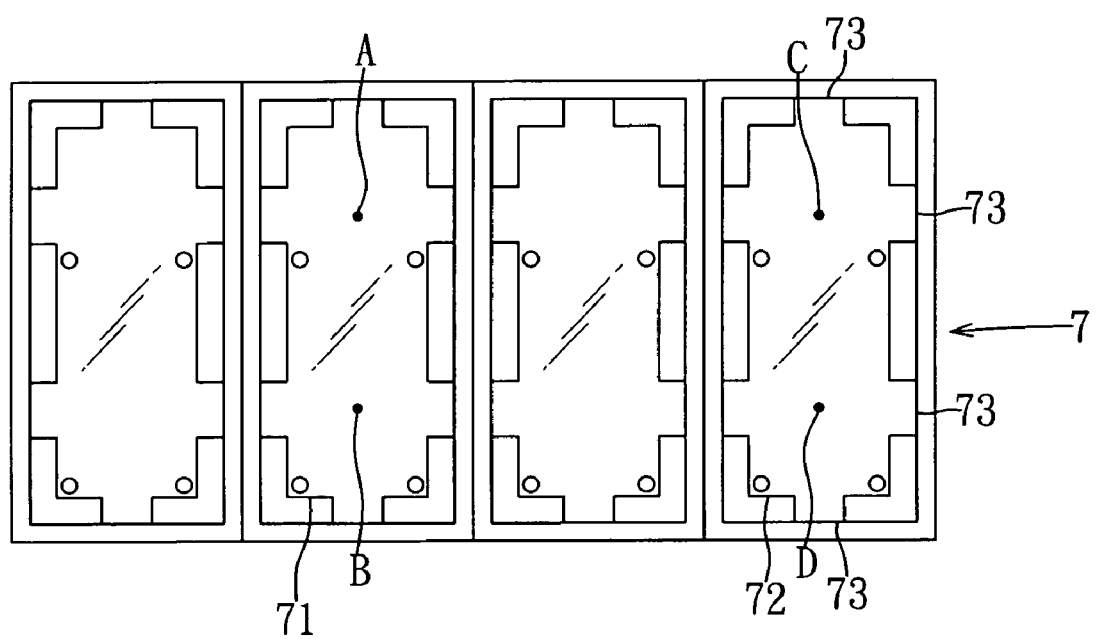
FIG. 6 is a top view showing a good printed circuit board panel having multiple interconnected PCB units.

It is first noted that each PCB unit of the printed circuit board panel is generally provided with a plurality of optical points, such as optical points A, B, C, and D shown in FIG. 6. The relative positional relationships among the optical points A, B, C, and D are fixed so as to serve as alignment points for the printed circuit board panel during component insertion on a production line. Therefore, in this embodiment, the optical points A, B, C, and D are used to assist positioning. To be specific, in step 81, a good printed circuit board panel 7 having multiple interconnected PCB units is placed on the work surface 31 of the reference platform 3. By means of the camera 531, an image of the good printed circuit board panel 7 is stored in the computer device 6. The operator sets the positions of the optical points A and B, and C and D on two good PCB units 71, 72 on the same side as comparison positioning reference data. The position of the good PCB unit 72 corresponds to the position of the vacant space 12 in the defective printed circuit board panel 1, whereas the position of the good PCB unit 71 corresponds to the position of a good PCB unit 13 of the defective printed circuit board panel 1 (see FIG. 1). Furthermore, according to a teaching method, paths for the laser 532 of the measuring unit 53, the glue injecting unit 54, and the glue clearing unit 55 are respectively predetermined in the computer device 6. The taught paths are work paths, and are set to be along the profile and a plurality of cutting seams 73 of the good PCB unit 72. However, the comparison positioning reference data may also be, but are not limited to, image data, profile data, or predetermined path data of the good printed circuit board panel 7. The predetermined path data are constructed by converting a manufacturing engineering drawing of the good printed circuit board panel 7 into a CAD or CAM file that is subsequently transmitted to the computer device 6. It is noted that if the printed circuit board panel to be subjected to board placement is of a type that has been previously processed using the present invention, step 81 can be omitted.

Figure 5:
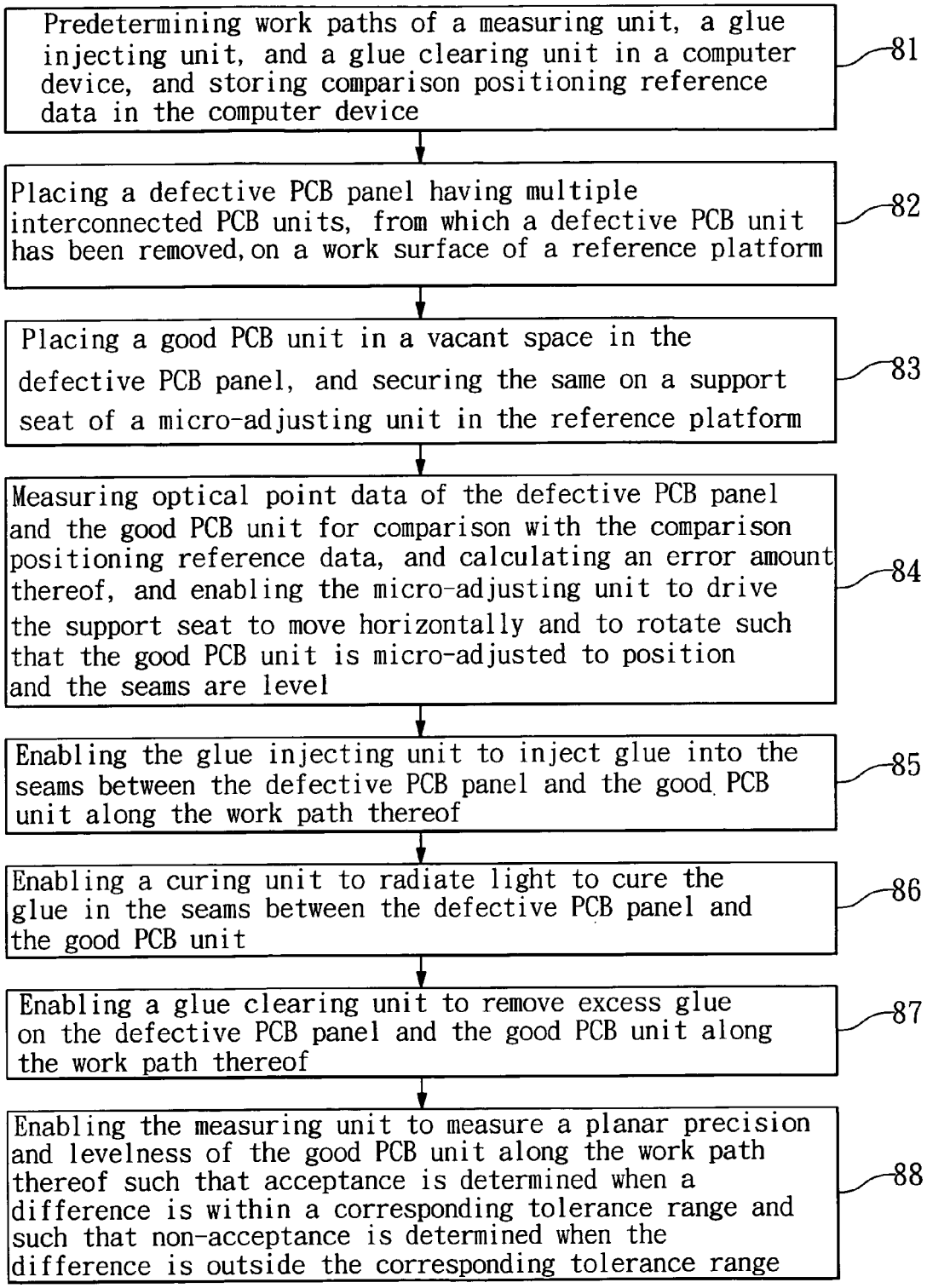
FIG. 5 is an operational flowchart of the board placement method of the first preferred embodiment.
Figure 7:
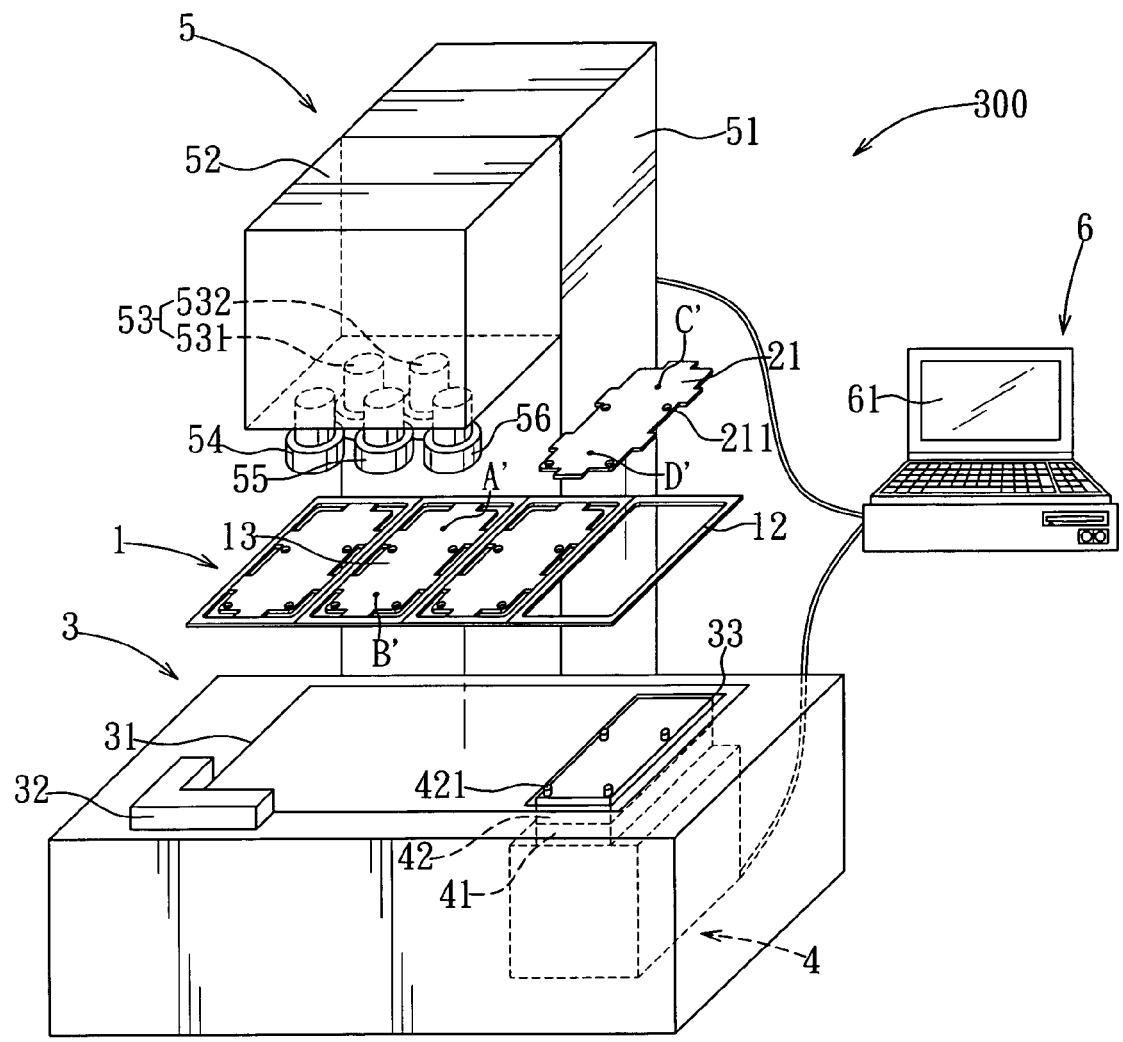
FIG. 7 is a perspective view of the board placement system of the first preferred embodiment in a state of placing a defective printed circuit board panel thereon.
Figure 8:
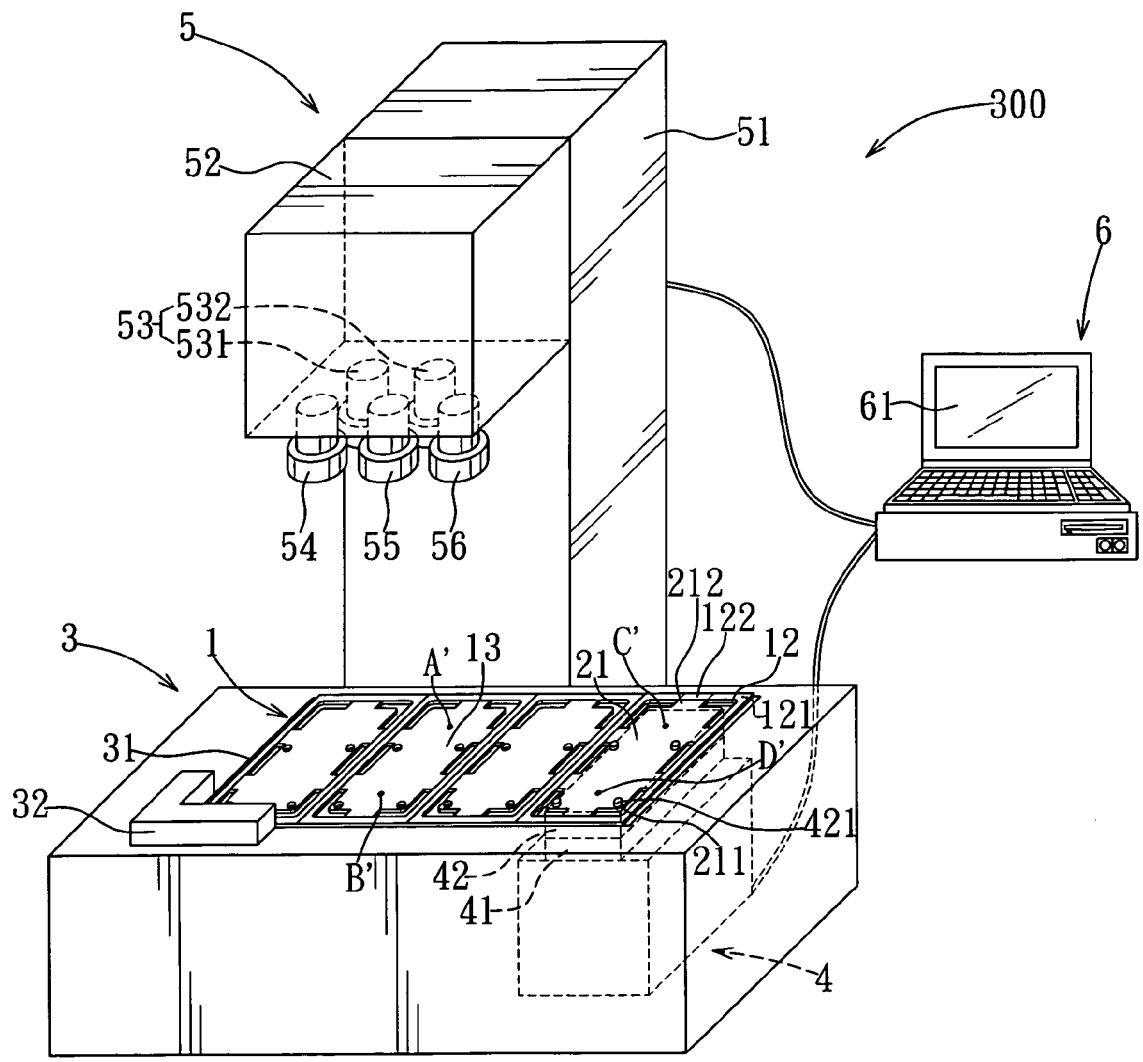
FIG. 8 is a perspective view of the board placement system of the first preferred embodiment with the defective printed circuit board panel placed thereon.

Referring to FIGS. 5, 7, and 8, in step 82, the defective printed circuit board panel 1 having the defective PCB unit 11 (see FIG. 1) removed therefrom is placed on the work surface 31 of the reference platform 3, with the vacant space 12 thereof registered with the opening 33 in the reference platform 3, and with a corner of the defective printed circuit board panel 1 abutting against an inner corner of the positioning frame 32 on the work surface 31 such that the defective printed circuit board panel 1 is positioned on the work surface 31.

Subsequently, in step 83, the good PCB unit 21 is placed in the vacant space 12 at the right side of the defective printed circuit board panel 1, with the positioning holes 211 respectively engaging the positioning pins 421 of the support seat 42 such that the good PCB unit 21 is secured on the support seat 42. It is noted that since the position of the defective PCB unit on the defective printed circuit board panel may not always be on the rightmost side, the vacant space 12 in the defective printed circuit board panel 1 can be first aligned with the opening 33 before the positioning frame 32 is caused to abut against a corner of the defective printed circuit board panel 1 to thereby accomplish the board positioning operation. In addition, the support seat 42 can be replaced according to the types of different good PCB units, and the positioning pins 421 on the support seat 42 can be replaced to match the positioning holes in different types of good PCB units so as to be suitable for placement and securing of different types of good PCB units. Furthermore, the good PCB unit 21 can be secured on the support seat 42 using a movable clamp, a vacuum suction disk, or any other means, without being limited to what is disclosed in this embodiment.

Referring to FIGS. 5, 6, 7, and 8, in step 84, the camera 531 of the measuring unit 53 is activated to take a picture of the defective printed circuit board panel 1 so as to obtain an image of the entire defective printed circuit board panel 1 and the good PCB unit 21 for transmission to the computer device 6. The computer device 6 can then use the image to calculate positions of two optical points A', B' on the good PCB unit 13 of the defective printed circuit board panel 1, and the position data (e.g., coordinates) of two optical points C', D' on the good PCB unit 21. The computer device 6 first performs registration of the positions of the optical points A, B in the comparison positioning reference data as stored therein with the optical points A', B' on the defective printed circuit board panel 1, i.e., causing the optical points A, B to displace to and to overlap with the optical points A', B'. Coordinates of the optical points C, D in the comparison positioning reference data after registration can be correspondingly inferred from the amount of displacement to serve as target positions of the optical points C', D' of the good PCB unit 21.

Figure 9:
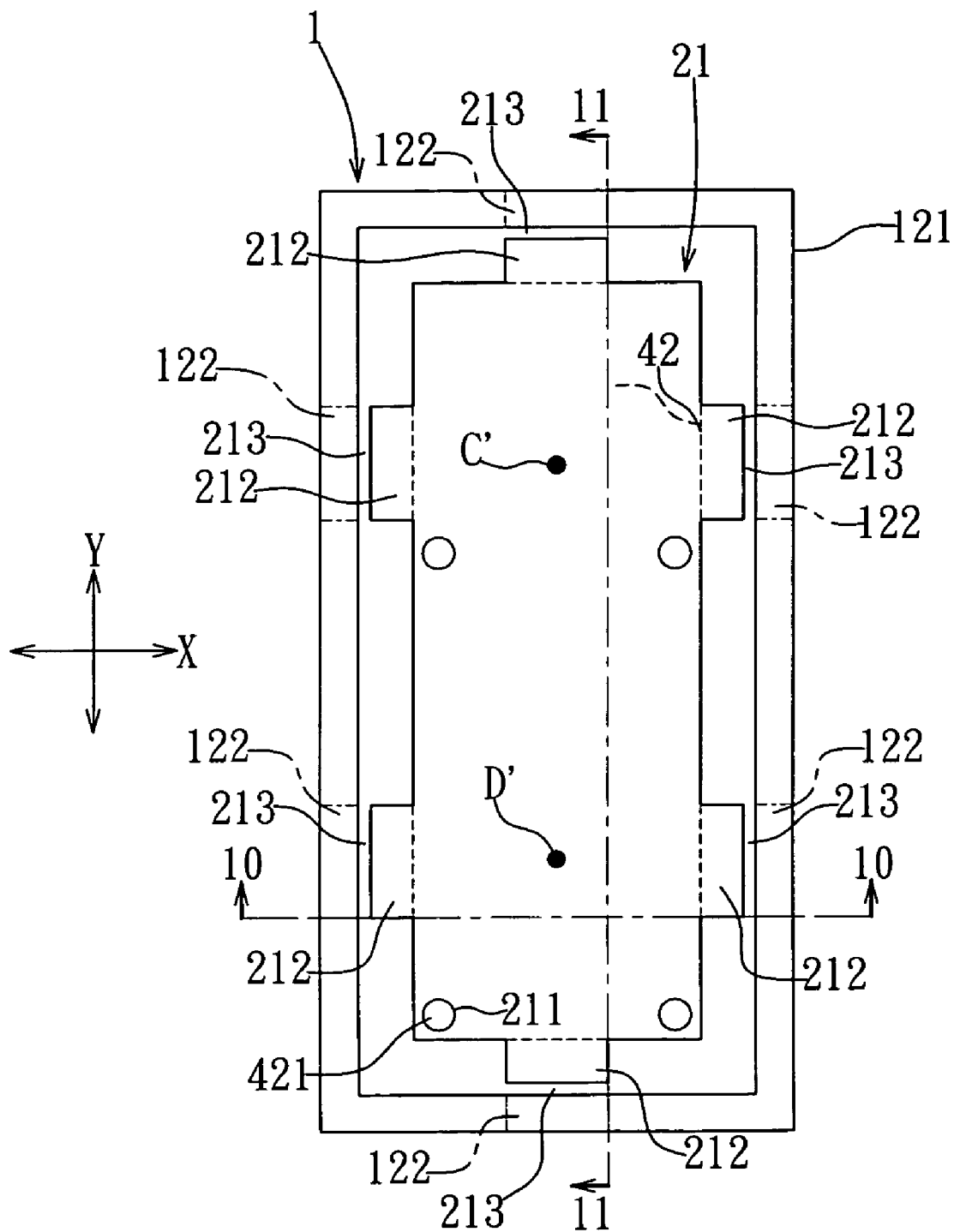
FIG. 9 is a top view to illustrate how a good PCB unit is arranged in a vacant space in the defective printed circuit board panel having multiple interconnected PCB units in the first preferred embodiment.
Figure 10:
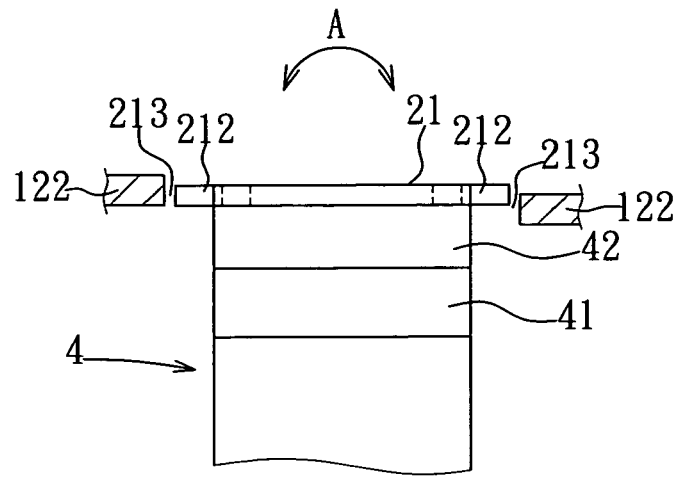
FIG. 10 is a schematic partly sectional view taken along line 10-10 of FIG. 9.
Figure 11:
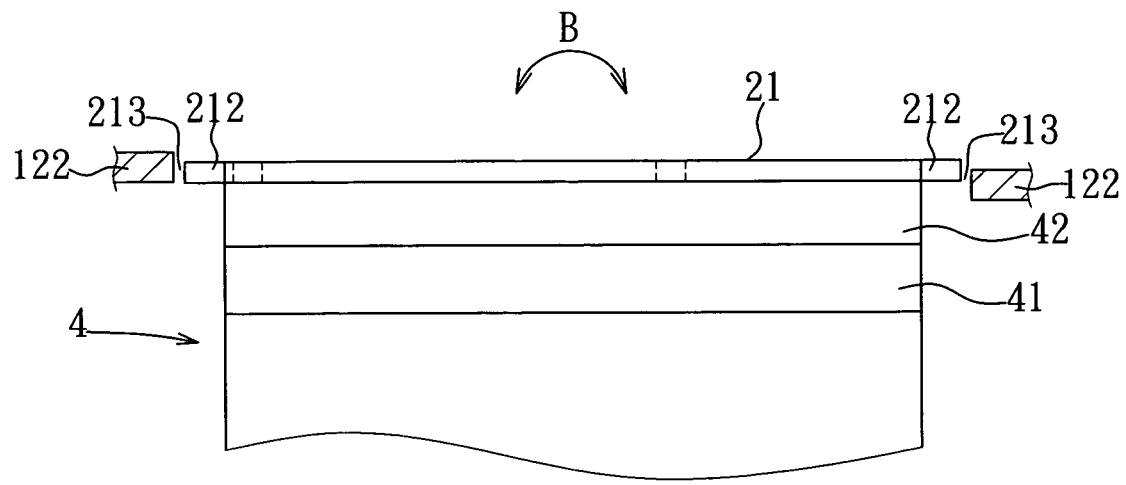
FIG. 11 is a schematic partly sectional view taken along line 11-11 of FIG. 9.

The computer device 6 calculates an error between the target positions and the current positions of the optical points C', D', and subsequently drives the micro-adjusting table 41 of the micro-adjusting unit 4 to bring the support seat 42 to perform precise micron movement in horizontal directions of the X-axis and the Y-axis, as shown in FIG. 9, and to concurrently perform precise micron rotation in the direction indicated by the arrow (C) with the third axial line (L3) shown in FIG. 4 as axis such that the optical points C', D' of the good PCB unit 21 are micro-adjusted to the target positions, thereby accomplishing a translational positioning operation.

Figure 12:
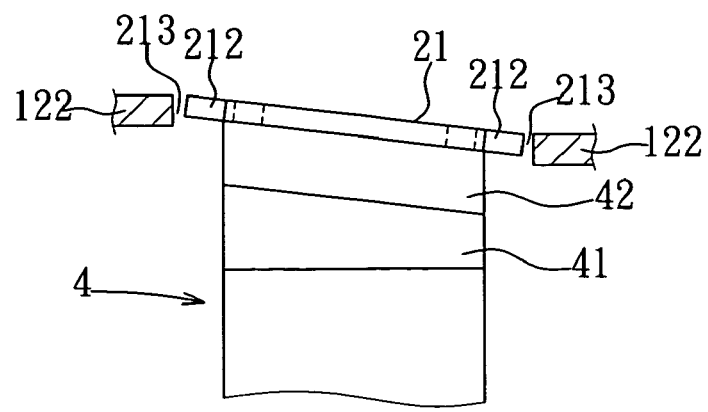
FIG. 12 is a view similar to FIG. 10, showing that connecting portions of the good PCB unit after micro-adjustment and corresponding positions of the defective printed circuit board panel are in a level state.
Figure 13:
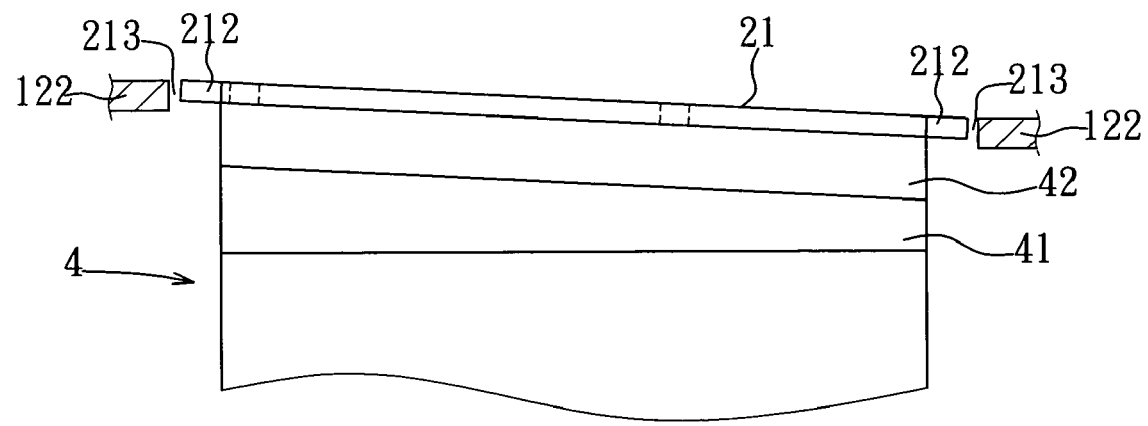
FIG. 13 is a view similar to FIG. 11, showing that the connecting portions of the good PCB unit after micro-adjustment and the corresponding positions of the defective printed circuit board panel are in a level state.

Furthermore, in order to eliminate a drop at the juncture between the good PCB unit 21 and the defective printed circuit board panel 1, in this embodiment, the laser 532 is used to first measure a height difference therebetween, and the micro-adjusting unit 4 is used to adjust the height position of the good PCB unit 21 until the latter is at the same height as a peripheral side 121 of the vacant space 12 in the defective printed circuit board panel 1. To be specific, referring to FIGS. 4, 5, 8, 9, 10, and 11, the laser 532 is activated to respectively measure height differences between the six connecting portions 212 of the good PCB unit 21 and six corresponding positions 122 at the peripheral side 121 of the vacant space 12 in the defective printed circuit board panel 1 along the predetermined path of the teaching method, i.e., using the laser 532 to respectively measure the connecting portions 212 and the corresponding positions 122 at the peripheral side 121 which are adjacent to the connecting portions 212, so as to obtain light reflecting times thereof for transmission to the computer device 6. The computer device 6 can use a difference between the light reflecting times to calculate a corresponding height difference so as to drive the micro-adjusting table 41 of the micro-adjusting unit 4 to bring the support seat 42 to move upward and downwardly along the Z-axis direction, and to further perform precise micron rotation in the directions indicated by the arrows (A) and (B) with the first and second axial lines (L1), (L2) as axes, as shown in FIGS. 12 and 13, such that the heights of the connecting portions 212 of the good PCB unit 21 and the corresponding positions 122 at the peripheral side 121 of the defective printed circuit board panel 1 are uniform, thereby achieving a most level state.

In step 85, after completion of the positioning and leveling operations, the computer device 6 infers an actual work path of the glue injecting unit 54 according to the coordinates of the optical points C', D' and the previously taught path so as to drive the glue injecting unit 54 to inject ultraviolet curable glue into seams 213 between the corresponding positions 122 at the peripheral side 121 of the defective printed circuit board panel 1 and the connecting portions 212 of the good PCB unit 21.

In step 86, after completion of the glue injection operation, the computer device 6 drives the curing unit 56 to radiate ultraviolet light so as to cure the ultraviolet curable glue between the corresponding positions 122 at the peripheral side 121 of the defective printed circuit board panel 1 and the connecting portions 212 of the good PCB unit 21. Thus, the good PCB unit 21 is bonded to the defective printed circuit board panel 1. In addition, as well known to those skilled in the art, the glue injecting unit 54 may employ other types of glue. It is merely necessary to adjust the functionality of the curing unit 56 in response to the curing condition of the glue. For instance, if a conventional heat curable glue is used, the curing unit 56 can radiate heat to cure the glue.

In step 87, after completion of the curing operation, the computer device 6 drives the glue clearing unit 55 to hover very closely above the defective printed circuit board panel 1 and the connecting portions 212 of the good PCB unit 21 along the actual work path thereof to remove excess glue at glue-filled spots, while buffering the glue-filled spots to obtain a level and neat appearance.

In step 88, after completion of the glue clearing operation, the computer device 6 will once again drive the measuring unit 53 to conduct a measuring operation for quality control purposes. First, the camera 531 is used to inspect a planar precision of the good PCB unit 21 after repair, and a difference between the fixed position of the good PCB unit 21 and the target position is recorded for comparison with a predetermined position tolerance range. Subsequently, the laser 532 is used to inspect the levelness of the connecting portions 212 of the good PCB unit 21 after curing of the glue along the predetermined path of the teaching method, and height differences between the connecting portions 212 of the good PCB unit 21 after fixing and the corresponding positions 122 of the printed circuit board panel 1 are recorded for comparison with a predetermined height tolerance range. When the recorded values are within the corresponding tolerance range, this indicates acceptance. The operator can then remove the printed circuit board panel thus repaired for subsequent packaging operations. On the other hand, if one of the recorded values is outside the corresponding tolerance range, this indicates non-acceptance, and it will be shown in red in a measurement record on the display screen 61. The operator then removes the unacceptable printed circuit board panel for further repair processing.

Figure 14:
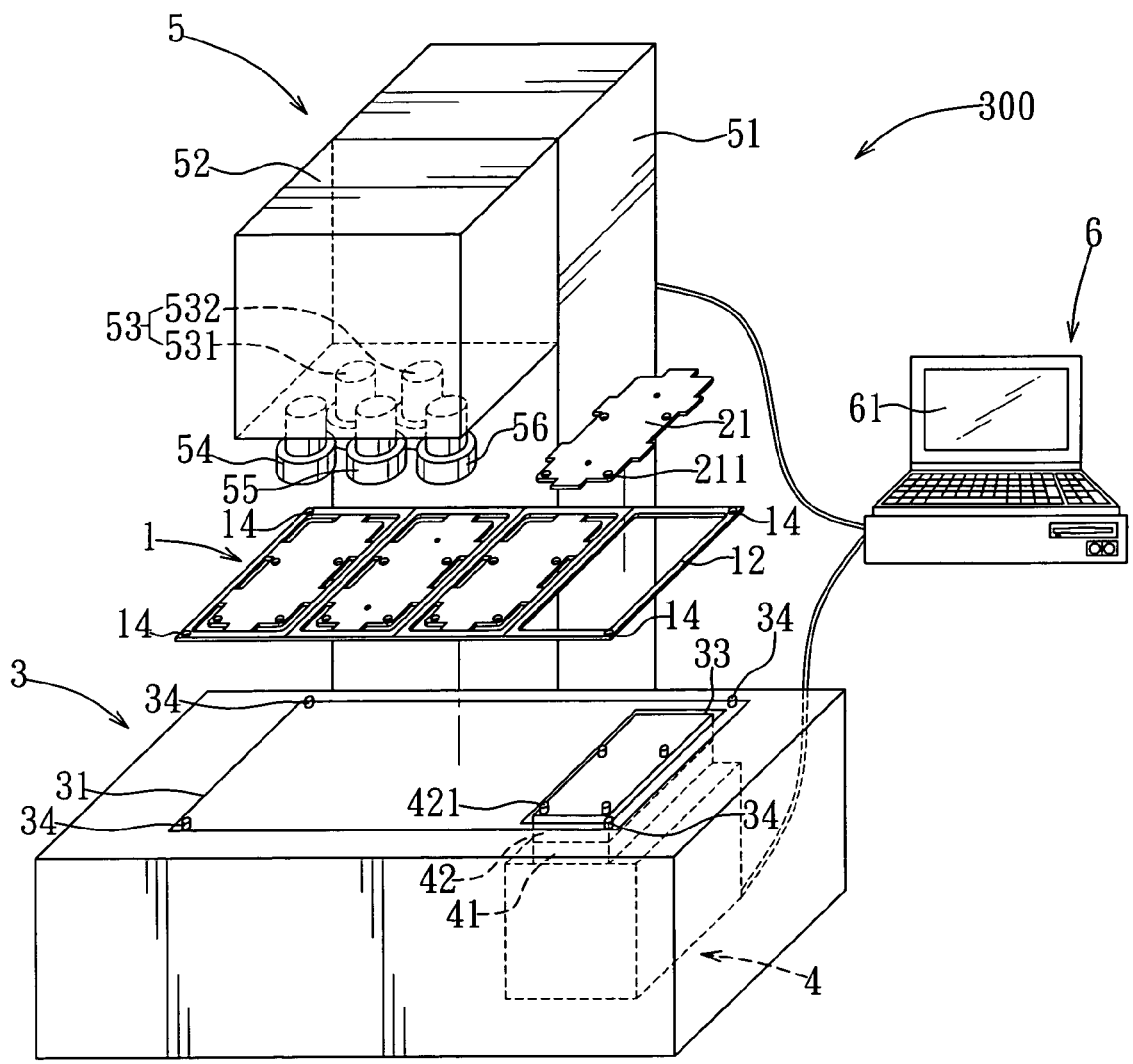
FIG. 14 is a perspective view of the second preferred embodiment of a board placement system according to the present invention, illustrating a state of placing a defective printed circuit board panel thereon.
Figure 15:
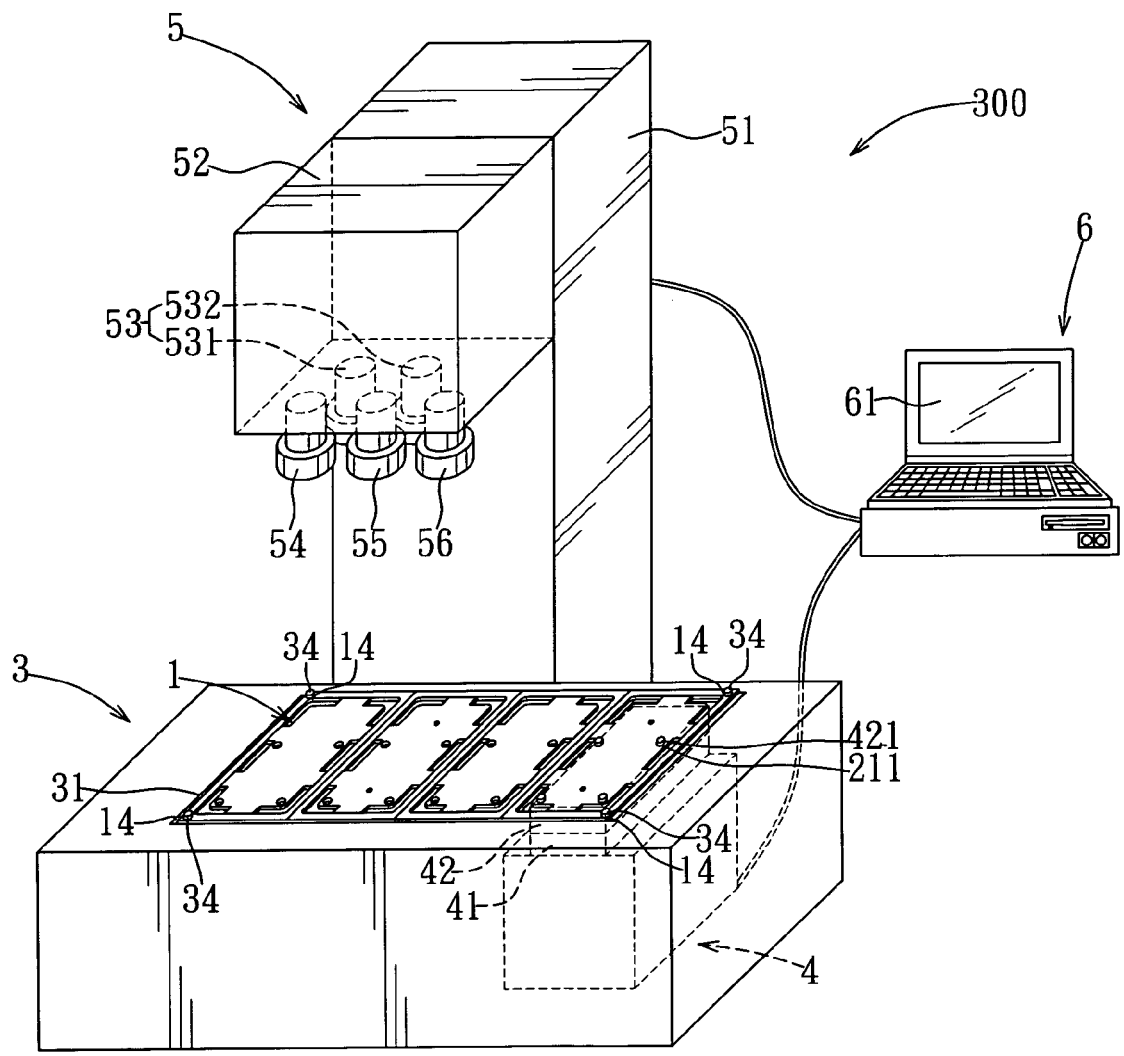
FIG. 15 is a perspective view of the board placement system of the second preferred embodiment, with the defective printed circuit board panel placed thereon.

FIGS. 14 and 15 show the second preferred embodiment of a board placement method and system for a defective printed circuit board panel having multiple interconnected PCB units according to the present invention, which is substantially the same as the first preferred embodiment in terms of the operating steps of the method and the overall construction of the system. The difference resides in that the defective printed circuit board panel 1 in this embodiment is provided with four holes 14, and the first positioning member includes four insert pins 34 that extend upward from the work surface 31 of the reference platform 3. By means of the holes 14 that engage the insert pins 34, the defective printed circuit board panel 1 can be positioned on the work surface 31 of the reference platform 3.

In sum, in the board placement method and system for a defective printed circuit board panel having multiple interconnected PCB units according to the present invention, the computer device 6 is employed to control the measuring unit 53, the glue injecting unit 54, the glue clearing unit 55, the curing unit 56, and the micro-adjusting unit 4 to perform automated operations, thereby increasing the precision and stability of the operations considerably, and enhancing the repair rate to permit fast mass production. Therefore, the objects of the present invention can be achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A board placement system for a printed circuit board having multiple interconnected printed circuit board units, comprising:
    a reference platform including a work surface and an opening formed in said work surface;
    a micro-adjusting unit provided within said reference platform, and including a micro-adjusting table, and a support seat which is disposed on said micro-adjusting table, which is located within said opening, and which is flush with said work surface, said micro-adjusting table being capable of bringing said support seat to move and rotate relative to said work surface;
    a measuring unit disposed on said reference platform and including a camera for measuring planar precision, and a laser for measuring levelness; and
    a computer device connected electrically to said micro-adjusting unit and said measuring unit, and capable of driving said measuring unit to move along a predetermined work path.

2. The board placement system according to claim 1, wherein said micro-adjusting table is operable to bring said support seat to move relative to said work surface along an X-axis direction, a Y-axis direction, and a Z-axis direction.

3. The board placement system according to claim 2, wherein a first axial line passing through midpoints of two opposite sides of said support seat, a second axial line passing through midpoints of two other sides of said support seat, and a third axial line at an intersection of said first and second axial lines and parallel to the Z-axis direction are defined, said micro-adjusting table being capable of driving said support seat to rotate relative to said work surface with said first, second and third axial lines as axes, respectively.

4. The board placement system according to claim 1, further comprising a mechanical arm disposed on said reference platform, said mechanical arm including a first support frame disposed on a rear side of said reference platform, and a second support frame disposed on a front side of said first support frame and located above said work surface, said first support frame being movable leftward and rightward relative to said reference platform along an X-axis direction, said second support frame being movable forward and rearward along a Y-axis direction and being movable upward and downward along a Z-axis direction relative to said first support frame.

5. The board placement system according to claim 4, wherein said camera and said laser of said measuring unit are respectively disposed at a bottom end of said second support frame.

6. The board placement system according to claim 4, further comprising a glue injecting unit disposed at a bottom end of said second support frame and capable of operation along a work path.

7. The board placement system according to claim 4, further comprising a glue clearing unit disposed at a bottom end of said second support frame and capable of operation along a work path.

8. The board placement system according to claim 7, wherein said glue clearing unit is a high-speed glue clearing head.

9. The board placement system according to claim 6, further comprising a curing unit disposed at the bottom end of said second support frame.

10. The board placement system according to claim 9, wherein said glue injecting unit is capable of injecting ultraviolet curable glue, and said curing unit is a light source capable of radiating ultraviolet light.

11. The board placement system according to claim 1, wherein said work surface is provided with a positioning member in the form of a positioning frame.

12. The board placement system according to claim 1, wherein said work surface is provided with a positioning member in the form of a plurality of insert pins.

13. The board placement system according to claim 1, wherein a top face of said support seat is provided with a plurality of positioning members in the form of positioning pins.

* * * * *